US010727096B2

(12) United States Patent
Nguyen et al.

(10) Patent No.: US 10,727,096 B2
(45) Date of Patent: *Jul. 28, 2020

(54) SYMMETRIC CHAMBER BODY DESIGN ARCHITECTURE TO ADDRESS VARIABLE PROCESS VOLUME WITH IMPROVED FLOW UNIFORMITY/GAS CONDUCTANCE

(71) Applicant: Applied Materials, Inc., Santa Clara, CA (US)

(72) Inventors: Andrew Nguyen, San Jose, CA (US); Yogananda Sarode Vishwanath, Bangalore (IN); Tom K. Cho, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/545,915

(22) Filed: Aug. 20, 2019

(65) Prior Publication Data

US 2019/0371627 A1    Dec. 5, 2019

Related U.S. Application Data

(63) Continuation of application No. 14/677,901, filed on Apr. 2, 2015, now Pat. No. 10,446,418.

(Continued)

(51) Int. Cl.
*C23C 16/44* (2006.01)
*H01L 21/67* (2006.01)
*H01J 37/32* (2006.01)

(52) U.S. Cl.
CPC .... *H01L 21/6719* (2013.01); *H01J 37/32449* (2013.01); *H01J 37/32458* (2013.01);
(Continued)

(58) Field of Classification Search
CPC ............ H01L 21/6719; H01J 37/32834; H01J 37/32458; H01J 37/32449; Y02P 90/14; G05B 2219/45031; C23C 16/4412
(Continued)

(56) References Cited

U.S. PATENT DOCUMENTS 5,708,556 A * 1/1998 van Os ............... C23C 16/4586
                                                          361/234
5,792,272 A * 8/1998 van Os ............... C23C 16/4405
                                                          118/723 R
(Continued)

FOREIGN PATENT DOCUMENTS

CN          1460287 A        12/2003
CN          1823180 A         8/2006
(Continued)

OTHER PUBLICATIONS

PCT Notification of Transmittal of the International Search Report and the Written Opinion of the International Searching Authority of International Application No. PCT/2015/020356 dated Jun. 24, 2015; 11 total pages.
(Continued)

*Primary Examiner* — Rudy Zervigon
(74) *Attorney, Agent, or Firm* — Patterson + Sheridan LLP

(57) ABSTRACT

The present disclosure generally relates to process chambers having modular design to provide variable process volume and improved flow conductance and uniformity. The modular design according to the present disclosure achieves improved process uniformity and symmetry with simplified chamber structure. The modular design further affords flexibility of performing various processes or processing sub-
(Continued)

strates of various sizes by replacing one of more modules in a modular process chamber according to the present disclosure.

20 Claims, 7 Drawing Sheets

Related U.S. Application Data

(60) Provisional application No. 61/977,222, filed on Apr. 9, 2014.

(52) U.S. Cl.
CPC .......... *H01J 37/32834* (2013.01); *G05B 2219/45031* (2013.01); *Y02P 90/14* (2015.11)

(58) Field of Classification Search
USPC .................................. 118/715; 156/345.29
See application file for complete search history.

(56) References Cited

U.S. PATENT DOCUMENTS

| | | | | |
|---|---|---|---|---|
| 5,820,723 A * | 10/1998 | Benjamin | H01J 37/16 | 156/345.51 |
| 5,838,528 A * | 11/1998 | van Os | C23C 16/4586 | 361/234 |
| 5,855,675 A * | 1/1999 | Doering | C23C 16/44 | 118/719 |
| 5,891,350 A * | 4/1999 | Shan | H01J 37/32477 | 118/723 E |
| 5,948,704 A * | 9/1999 | Benjamin | H01J 37/20 | 438/715 |
| 5,985,031 A * | 11/1999 | Davis | G03F 7/162 | 118/500 |
| 6,143,082 A * | 11/2000 | McInerney | C23C 16/4412 | 118/719 |
| 6,156,151 A * | 12/2000 | Komino | H01J 37/3244 | 156/345.29 |
| 6,277,237 B1 * | 8/2001 | Schoepp | H01J 37/32495 | 156/345.1 |
| 6,319,553 B1 * | 11/2001 | McInerney | C23C 16/4412 | 118/719 |
| 6,377,437 B1 * | 4/2002 | Sexton | H01L 21/6831 | 279/128 |
| 6,387,185 B2 * | 5/2002 | Doering | C23C 16/46 | 118/729 |
| 6,513,452 B2 * | 2/2003 | Shan | H01J 37/32477 | 118/715 |
| 6,567,258 B2 * | 5/2003 | Sexton | H01L 21/6831 | 279/128 |
| 6,663,714 B2 | 12/2003 | Mizuno et al. | | |
| 6,669,783 B2 * | 12/2003 | Sexton | H01L 21/67103 | 118/725 |
| 6,902,648 B2 * | 6/2005 | Numata | H01J 37/32522 | 118/723 E |
| 6,946,033 B2 * | 9/2005 | Tsuei | C23C 16/45565 | 118/715 |
| 7,732,728 B2 * | 6/2010 | Dhindsa | H01J 37/32568 | 156/345.33 |
| 8,142,567 B2 * | 3/2012 | Kobayashi | C23C 16/4412 | 118/715 |
| 8,173,928 B2 * | 5/2012 | Nozawa | C23C 16/4412 | 118/723 I |
| 8,236,105 B2 * | 8/2012 | Bera | C23C 16/4412 | 118/715 |
| 8,552,334 B2 * | 10/2013 | Tappan | H01J 37/32091 | 156/345.33 |
| 8,597,462 B2 * | 12/2013 | Brown | H01J 37/32495 | 156/345.37 |
| 8,617,347 B2 * | 12/2013 | Kim | C23C 16/4412 | 118/715 |
| 8,735,765 B2 * | 5/2014 | Tappan | H01J 37/32091 | 156/345.33 |
| 8,840,725 B2 * | 9/2014 | Palagashvili | H01J 37/32091 | 118/715 |
| 8,895,452 B2 * | 11/2014 | Antolik | H01J 37/32091 | 438/715 |
| 9,082,590 B2 * | 7/2015 | Carducci | H05H 1/46 | |
| 9,269,564 B2 * | 2/2016 | Han | H01L 21/02104 | |
| 9,378,971 B1 * | 6/2016 | Briggs | H01L 21/30655 | |
| 9,384,998 B2 * | 7/2016 | Hudson | H01L 21/31116 | |
| 9,449,794 B2 * | 9/2016 | Nguyen | H05H 1/46 | |
| 9,490,135 B2 * | 11/2016 | Brown | H01J 37/32495 | |
| 9,543,148 B1 * | 1/2017 | Hudson | H01L 21/6719 | |
| 9,543,158 B2 * | 1/2017 | Hudson | H01J 37/32091 | |
| 9,609,730 B2 * | 3/2017 | Fischer | H05G 2/003 | |
| 9,620,377 B2 * | 4/2017 | Hudson | H01L 21/30655 | |
| 9,721,803 B2 * | 8/2017 | Takaba | H01L 21/31116 | |
| 9,741,546 B2 * | 8/2017 | Carducci | H05H 1/46 | |
| 9,745,663 B2 * | 8/2017 | Nguyen | C23C 14/28 | |
| 9,870,897 B2 * | 1/2018 | Carducci | H05H 1/46 | |
| 9,887,097 B2 * | 2/2018 | Hudson | H01L 21/31138 | |
| 9,896,769 B2 * | 2/2018 | Nguyen | H01J 37/3211 | |
| 9,928,987 B2 * | 3/2018 | Kenney | H01J 37/04 | |
| 9,997,372 B2 * | 6/2018 | Briggs | H01L 21/30655 | |
| 9,997,373 B2 * | 6/2018 | Hudson | H01J 37/32513 | |
| 10,170,279 B2 * | 1/2019 | Kenney | H01J 37/3211 | |
| 10,170,323 B2 * | 1/2019 | Hudson | H01L 21/30655 | |
| 10,170,324 B2 * | 1/2019 | Dole | H01L 28/00 | |
| RE47,275 E * | 3/2019 | Antolik | H01L 21/67069 | |
| 10,304,693 B2 * | 5/2019 | Hudson | H01L 21/31138 | |
| 10,358,715 B2 * | 7/2019 | Kaufman-Osborn | H01L 21/67742 | |
| 10,373,840 B2 * | 8/2019 | Hudson | H01L 21/3065 | |
| 10,431,458 B2 * | 10/2019 | Hudson | H01L 21/0332 | |
| 10,446,418 B2 * | 10/2019 | Nguyen | H01J 37/32458 | |
| 10,453,656 B2 * | 10/2019 | Carducci | H05H 1/46 | |
| 10,535,502 B2 * | 1/2020 | Carducci | H05H 1/46 | |
| 10,546,728 B2 * | 1/2020 | Carducci | H01J 37/32082 | |
| 10,559,451 B2 * | 2/2020 | Kalnin | F16K 5/12 | |
| 10,580,620 B2 * | 3/2020 | Carducci | H01J 37/3244 | |
| 10,586,686 B2 * | 3/2020 | Nam | H01L 21/6831 | |
| 2001/0030024 A1 * | 10/2001 | Sago | H01J 37/32532 | 156/345.51 |
| 2001/0032591 A1 * | 10/2001 | Carducci | C23C 16/4412 | 118/723 E |
| 2004/0050492 A1 * | 3/2004 | Tsuei | C23C 16/45565 | 156/345.33 |
| 2005/0139321 A1 * | 6/2005 | Higashiura | C23C 16/5096 | 156/345.44 |
| 2005/0224180 A1 * | 10/2005 | Bera | C23C 16/4412 | 156/345.33 |
| 2009/0155936 A1 | 6/2009 | Weiner et al. | | |
| 2010/0081284 A1 | 4/2010 | Balakrishna et al. | | |
| 2010/0204810 A1 * | 8/2010 | Saito | H01J 37/32522 | 700/90 |
| 2011/0143551 A1 | 6/2011 | Borean et al. | | |
| 2012/0024479 A1 | 2/2012 | Palagashvili et al. | | |
| 2012/0161405 A1 * | 6/2012 | Mohn | C23C 16/401 | 279/142 |
| 2012/0269968 A1 | 10/2012 | Rayner, Jr. | | |
| 2013/0087286 A1 * | 4/2013 | Carducci | H01J 37/32541 | 156/345.43 |
| 2013/0323860 A1 * | 12/2013 | Antolik | H01L 21/6719 | 438/14 |
| 2013/0334199 A1 | 12/2013 | Yousif et al. | | |
| 2015/0145413 A1 * | 5/2015 | Merry | F16K 1/24 | 315/110 |
| 2015/0218697 A1 | 8/2015 | Nguyen et al. | | |
| 2015/0262794 A1 * | 9/2015 | Kihara | H01J 37/32174 | 216/71 |
| 2015/0293527 A1 * | 10/2015 | Nguyen | H01L 21/6719 | 700/121 |
| 2016/0215883 A1 * | 7/2016 | Nguyen | H01J 37/32899 | |
| 2016/0314936 A1 * | 10/2016 | Carducci | H01J 37/32834 | |
| 2016/0314937 A1 * | 10/2016 | Carducci | H01J 37/32568 | |
| 2016/0314940 A1 * | 10/2016 | Carducci | H01J 37/32082 | |
| 2016/0314942 A1 * | 10/2016 | Carducci | H01J 37/32082 | |
| 2017/0069466 A1 * | 3/2017 | Tran | H01J 37/32082 | |

(56) References Cited

U.S. PATENT DOCUMENTS

| | | | | |
|---|---|---|---|---|
| 2017/0213707 | A1* | 7/2017 | Matsuura | H01J 37/32871 |
| 2017/0271129 | A1* | 9/2017 | Carducci | H01J 37/32082 |
| 2017/0350004 | A1* | 12/2017 | Kaufman-Osborn | H01J 37/32733 |
| 2018/0047547 | A1* | 2/2018 | Matsumoto | H01L 21/3065 |
| 2018/0061619 | A1* | 3/2018 | Matsuura | H01L 21/6719 |
| 2018/0233327 | A1* | 8/2018 | Kalnin | H01J 37/32834 |
| 2019/0267219 | A1* | 8/2019 | Uemura | H01J 37/32715 |
| 2019/0371627 | A1* | 12/2019 | Nguyen | H01J 37/32458 |

FOREIGN PATENT DOCUMENTS

| | | | | |
|---|---|---|---|---|
| JP | 2008060258 | A | 3/2008 | |
| JP | 4422295 | B2 | 2/2010 | |
| JP | 2013-179504 | A | 9/2013 | |
| JP | 2013179054 | A * | 9/2013 | H01J 37/32082 |
| WO | 2009136019 | A3 | 12/2009 | |

OTHER PUBLICATIONS

Chinese Office Action (with attached English translation) for Application No. 201580001474.0; dated Nov. 2, 2018; 13 total pages.
Taiwanese Office Action (with attached English translation of the Search Report) for Apptication No. 104109397; dated Nov. 22, 2018; 9 total pages.
Japanese Office Action (with attached English translation) for Application No. 2017-505048; dated Dec. 28, 2018; 9 total pages.
Chinese Office Action dated Oct. 9, 2019 for Application No. 201580001474.0 (APPM/021615CNP).
Chinese Office Action dated May 6, 2020 for Application No. 201580001474.0 (APPM/021615CNP).

* cited by examiner

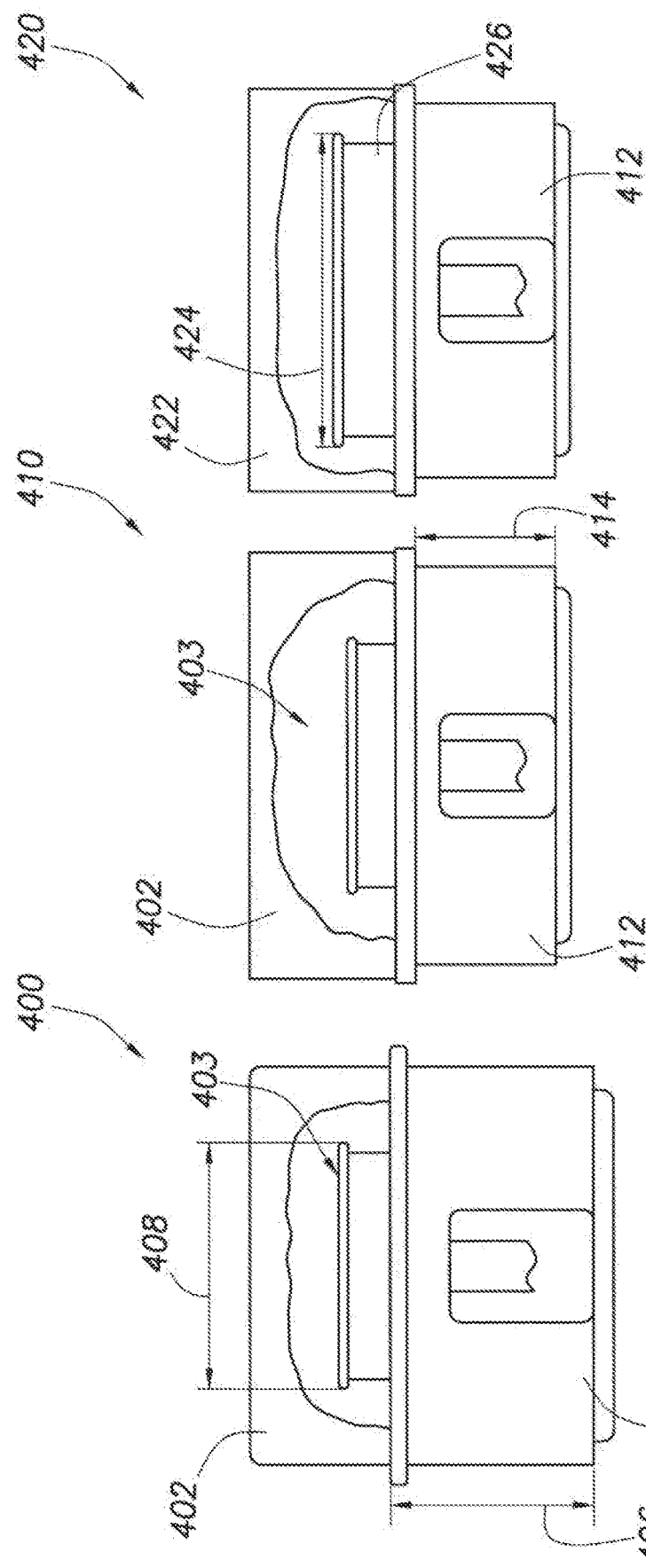

SYMMETRIC CHAMBER BODY DESIGN ARCHITECTURE TO ADDRESS VARIABLE PROCESS VOLUME WITH IMPROVED FLOW UNIFORMITY/GAS CONDUCTANCE

CROSS-REFERENCE TO RELATED APPLICATIONS

This application is a continuation application of co-pending U.S. patent application Ser. No. 14/677,901, filed on Apr. 2, 2015, which claims benefit of and priority to U.S. Provisional Patent Application Ser. No. 61/977,222, filed on Apr. 9, 2014. Each of U.S. patent application Ser. No. 14/677,901 and U.S. Provisional Patent App. No. 61/977,222 is incorporated by reference in its entirety herein.

BACKGROUND

Field

Embodiments of the present disclosure relate to apparatus and methods for processing semiconductor substrates. More particularly, embodiments of the present disclosure relate to a process chamber having modular design to provide variable process volume and improved flow conductance and uniformity.

Description of the Related Art

Electronic devices, such as flat panel displays and integrated circuits, commonly are fabricated by a series of processes in which layers are deposited on a substrate and the deposited material is etched into desired patterns. The processes commonly include physical vapor deposition (PVD), chemical vapor deposition (CVD), plasma enhanced CVD (PECVD), and other plasma processing. Specifically, a plasma process includes supplying a process gas mixture to a vacuum chamber, and applying radial frequency power (RF power) to excite the process gas into a plasma state. The plasma decomposes the gas mixture into ion species that would perform the desired deposition or etch processes.

One problem encountered during plasma processes is the difficulty associated with establishing uniform plasma density over the substrate surface during processing, which leads to non-uniform processing between the center region and the edge regions of a substrate. The difficulty in establishing uniform plasma density may be contributed by skews in natural electrical current, gas flow, and thermal distribution due to asymmetries in the physical process chamber design. Such skews not only result in non-uniform plasma density, but also make it difficult to use other processing variables or "knobs" to control center-to-edge plasma uniformity.

Optimal process parameters, such as process volume, distance between a substrate and a gas distribution showerhead, are generally different for different processes. For example, different process volumes are desirable when etching a conductor layer, etching a dielectric layer or stripping a photoresist layer. To satisfy different processes, multiple process chambers may be needed, which increases cost of ownership.

Therefore, there is a need for a process chamber that enables variable process volume, improved flow conductance, and improved process uniformity.

SUMMARY

Embodiments of the present disclosure relate to a process chamber having modular design to provide variable process volume, improved flow conductance, and improved process uniformity.

One embodiment provides an apparatus for processing a substrate. The apparatus includes a process module enclosing a process region, and a flow module attached to the process module. The flow module defines evacuation channels and an atmosphere volume. The evacuation channels connect the process region of the process module and an exhaust system attached to the flow module. The apparatus further includes a substrate support assembly comprising a support plate and a shaft. The support plate is disposed in the process region to support a substrate therein, and the shaft extends from the processing region of the process module to the atmosphere volume of the flow module.

Another embodiment provides a flow module for providing symmetric flow path to a process chamber. The flow module includes an outer wall shaped to connect with a chamber body of the process chamber, an inner wall, two or more pairs of radial walls connected between the outer wall and the inner wall, and a bottom wall. Two or more evacuation channels are defined between the inner wall and the outer wall of the two or more pairs of radial walls. The bottom wall is coupled to the inner wall and the two or more pairs of radial walls. An atmosphere volume is defined by the inner wall, the bottom wall and the two or more pairs of radial walls.

Another embodiment provides a plasma process chamber. The plasma process chamber includes a process module comprising a chamber body enclosing a process region, a substrate support assembly disposed along a central axis. The plasma process chamber further includes a source module disposed over the chamber body above the process region. The source module comprises an upper electrode opposing the substrate support assembly. The plasma process chamber further includes a flow module disposed below the process module and an exhaust module attached to the flow module. The flow module defines evacuation channels and an atmosphere volume. The evacuation channels connect to the process region of the process module. The atmosphere volume receives a shaft of the substrate support assembly. The exhaust module is in fluid communication with the evacuation channels of the flow module.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 4A-4C are schematic sectional views of process chambers assembled from various modules according to embodiments of the present disclosure.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present disclosure generally relates to process chambers having modular design to provide variable process volumes, improved flow conductance, and/or process uniformity. The modular design according to the present disclosure achieves improved process uniformity and symmetry with a simplified chamber structure. The modular design further affords flexibility for performing various processes or processing substrates of various sizes by replacing one or more modules of the modular process chamber.

Figure 1A:
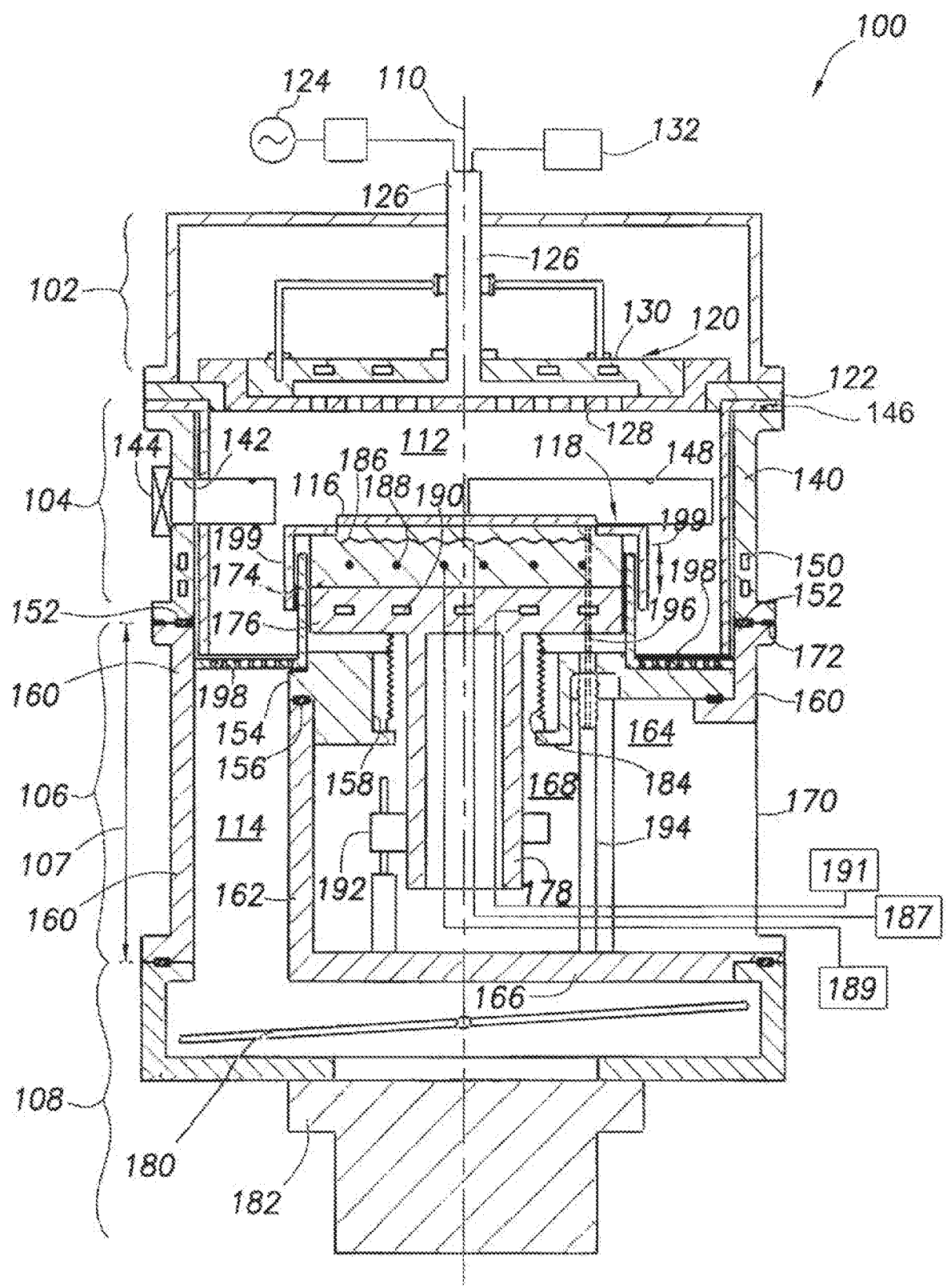
FIG. 1A is a schematic sectional view of a plasma process chamber according to one embodiment of the present disclosure.

FIG. 1A is a schematic sectional view of a plasma process chamber 100 according to one embodiment of the present disclosure. The plasma process chamber 100 may be a plasma etch chamber, a plasma enhanced chemical vapor deposition chamber, a physical vapor deposition chamber, a plasma treatment chamber, an ion implantation chamber, or other suitable vacuum processing chamber.

The plasma process chamber 100 may be assembled from multiple modules. The modular design enables the plasma process chamber 100 to meet various process requirements. As shown in FIG. 1A, the plasma process chamber 100 may include a source module 102, a process module 104, a flow module 106, and an exhaust module 108. The source module 102, the process module 104 and the flow module 106 collectively enclose a process region 112. During operation, a substrate 116 may be positioned on a substrate support assembly 118 and exposed to a process environment, such as plasma generated in the process region 112. Exemplary process which may be performed in the plasma process chamber 100 may include etching, chemical vapor deposition, physical vapor deposition, implantation, plasma annealing, plasma treating, abatement, or other plasma processes. Vacuum may be maintained in the process region 112 by suction from the exhaust module 108 through evacuation channels 114 defined by the flow module 106.

The process region 112 and the evacuation channels 114 are substantially symmetrically about a central axis 110 to provide symmetrical electrical current, gas flow, and thermal flow to establish uniform process conditions.

In one embodiment, as shown in FIG. 1A, the source module 102 may be a capacitively coupled plasma source. The source module 102 may include an upper electrode 120 (or anode) isolated from and supported by the process module 104 by an isolator 122. The upper electrode 120 may include a showerhead plate 128 attached to a heat transfer plate 130. The upper electrode 120 may be connected to a gas source 132 through a gas inlet tube 126. The showerhead plate 128, the heat transfer plate 130, and the gas inlet tube 126 may be all fabricated from a radial frequency (RF) conductive material, such as aluminum or stainless steel. The upper electrode 120 may be coupled to a RF power source 124 via the conductive gas inlet tube 126. The conductive gas inlet tube 126 may be coaxial with the central axis 110 of the plasma process chamber 100 so that both RF power and processing gases are symmetrically provided.

Even though a capacitive plasma source is described above, the source module 102 may be any suitable gas/plasma source according to a process requirement. For example, the source module 102 may be an inductive coupled plasma source, a remote plasma source, or a microwave plasma source.

The process module 104 is coupled to the source module 102. The process module 104 may include a chamber body 140 enclosing the process region 112. The chamber body 140 may be fabricated from a conductive material resistive to processing environments, such as aluminum or stainless steel. The substrate support assembly 118 may be centrally disposed within the chamber body 140 and positioned to support the substrate 116 in the process region 112 symmetrically about the central axis 110.

A slit valve opening 142 may be formed through the chamber body 140 to allow passages of the substrate 116. A slit valve 144 may be disposed outside the chamber body 140 to selectively open and close the slit valve opening 142.

In one embodiment, an upper liner assembly 146 may be disposed within an upper portion of the chamber body 140 shielding the chamber body 140 from the process environment. The upper liner assembly 146 may include an opening 148 corresponding to the slit valve opening 142 formed in the chamber body 140. In one embodiment, the upper liner assembly 146 may include two or more openings 148 formed symmetrically about the central axis 110 to compensate for the asymmetry of the chamber body 140 caused by the slit valve opening 142, thus creating symmetry in the process region 112 within the plasma process chamber 100. For example, the upper liner assembly 146 may be a cylindrical wall having three identical openings 148 formed 120 degrees apart from one another. The upper liner assembly 146 may be constructed from a conductive, process compatible material, such as aluminum, stainless steel, and/or yttria (e.g., yttria coated aluminum).

In one embodiment, cooling channels 150 may be formed in the chamber body 140 to provide temperature control to the chamber body 140 and the upper liner assembly 146 to enhance the thermal symmetry within the plasma process chamber 100 and symmetry of the plasma provided in the process region 112.

The flow module 106 is attached to the process module 104. The flow module 106 provides flow paths between the process region 112 defined in the process module 104 and the exhaust module 108. The flow module 106 also provides an interface between the substrate support assembly 118 and the atmospheric environment exterior to the plasma process chamber 100.

Figure 1B:
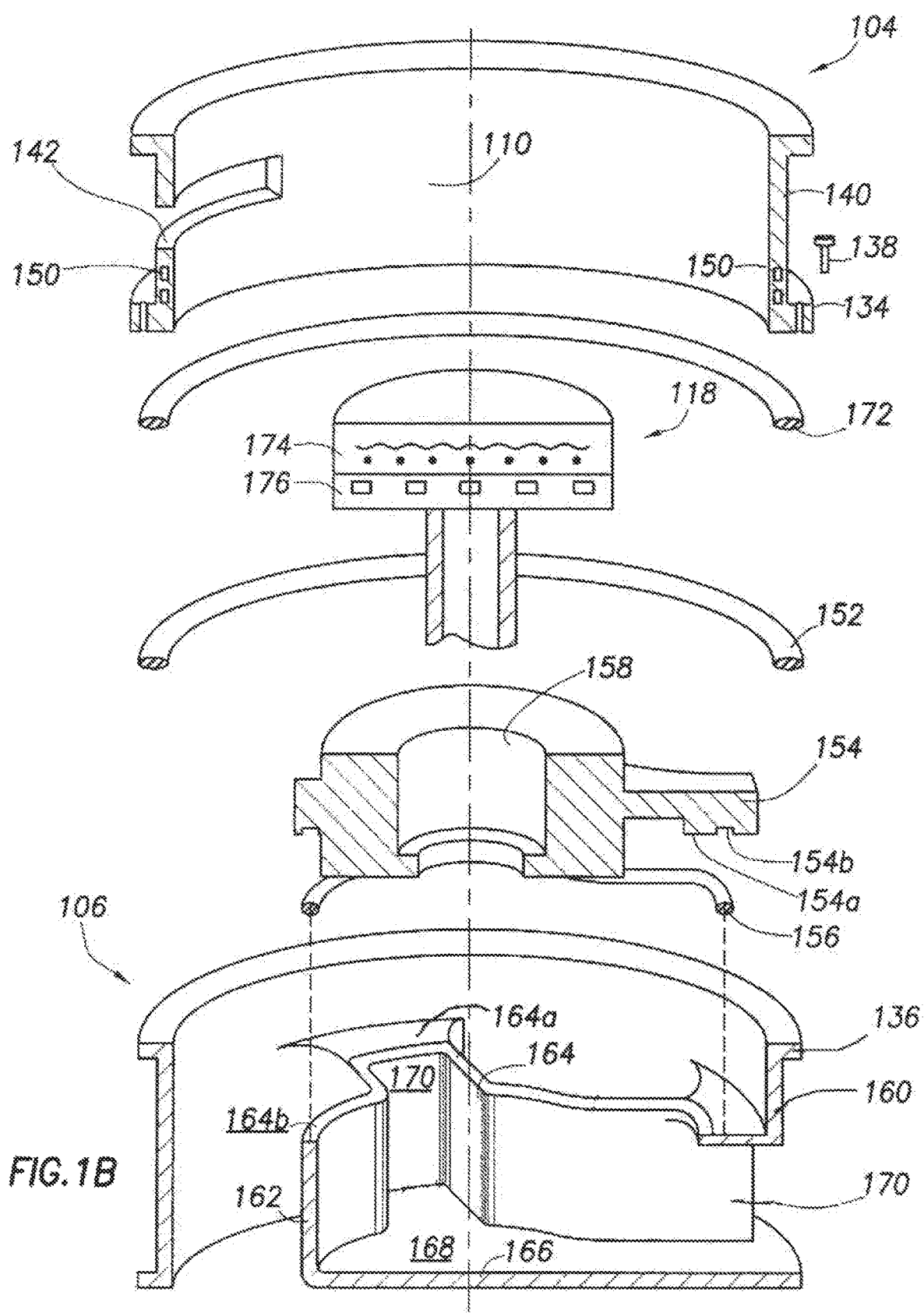
FIG. 1B is a schematic partial exploded view of the plasma process chamber of FIG. 1A showing a process module and a flow module.
Figure 1C:
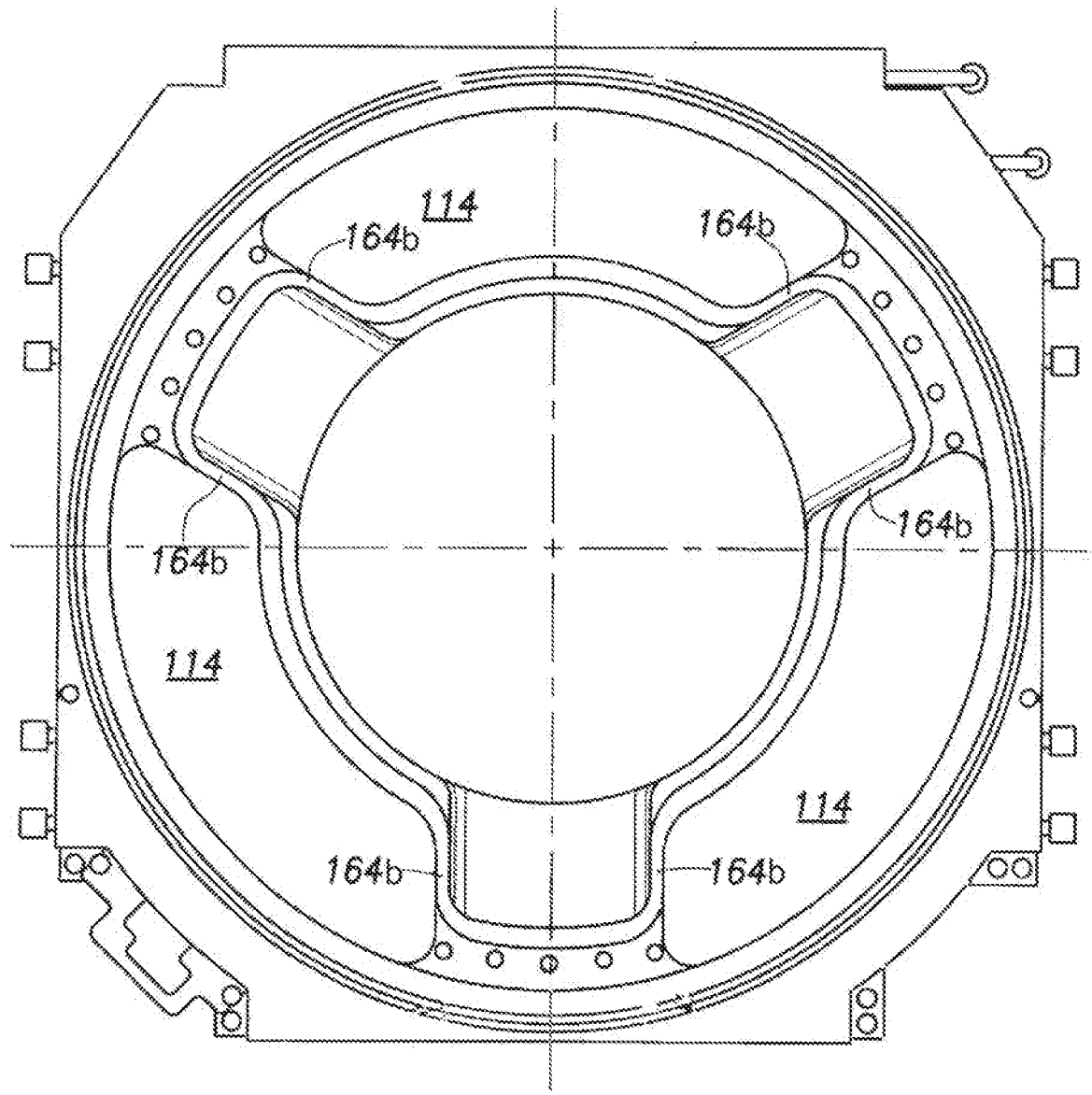
FIG. 1C is a schematic top view of the process module and the flow module with a substrate support assembly removed.

FIG. 1B is a schematic partial exploded view of the plasma process chamber 100 showing the assembly of the process module 104 and the flow module 106. FIG. 1C is a schematic top view of the process module 104 and the flow module 106 with the substrate support assembly 118 removed. The flow module 106 has a height 107. The height 107 may be selected according to amount of vertical movement or degree of variable volume dictated by the process requirements. Accordingly, when building a process chamber for a particular process, a flow module with a suitable height may be selected to meet the process requirements.

The flow module may be swapped for another flow module with a different height when configuring the process chamber for a different process.

The flow module 106 includes an outer wall 160, an inner wall 162, two or more pairs of radial walls 164 connecting between the inner wall 162 and the outer wall 160, and a bottom wall 166 attached to the inner wall 162 and the two or more pairs of radial walls 164. The outer wall 160 may include two or more through holes 170 formed between each pair of radial walls 164. A chassis 154 may be sealingly disposed over the inner wall 162 and the two or more pairs of radial walls 164. The through holes 170 connect an atmosphere volume 168 defined by the inner wall 162 with the exterior environment, thus accommodating utility connections, such as electrical connection, gas connection, cooling fluid connection. The chassis 154 may include a central opening 158 for receiving the substrate support assembly 118.

The outer wall 160 of the flow module 106 is shaped to match the chamber body 140 of the process module 104. In one embodiment, the outer wall 160 may include a flange 136 corresponds to a flange 134 on the chamber body 140. A plurality of bolts 138 may be used to secure the flange 134 and the flange 136 to couple the flow module 106 to the process module 104. In one embodiment, a seal 152 may be disposed between the flange 134 of the chamber body 140 and the flange 136 of the outer wall 160 to form a vacuum seal therebetween. The seal 152 may be an o-ring or other type of seal. In one embodiment, a RF grounding gasket 172 may be disposed between the flow module 106 and the process module 104 to provide a solid contact therebetween for a uniform and symmetric RF ground return path.

The inner wall 162, bottom wall 166, radial walls 164 and the chassis 154 divide the volume inside the outer wall 160 into the evacuation channels 114 and the atmosphere volume 168. The evacuation channels 114 connect with the process region 112 of the process module 104. A lower surface 154a of the chassis 154 may include a groove 154b matching a groove 164b (shown in FIG. 1C) formed on an upper surface 164a of the inner wall 162 and the two or more pairs of the radial walls 164. A seal 156 may be disposed in the grooves 154b, 164b to provide vacuum seal between the evacuation channels 114 and the atmosphere volume 168. The seal 156 may be an o-ring or other type of seal.

The outer wall 160 and the inner wall 162 may be cylindrical walls concentrically arranged. When assembled, a central axis of the outer wall 160 and the inner wall 162 coincides with the central axis 110 of the plasma process chamber 100. The two or more pairs of radial walls 164 are arranged between the inner wall 162 and the outer wall 160 to divide the space therebetween into the evacuation channels 114 and through holes 170. In one embodiment, the two or more pairs of radial walls 164 are arranged so that the evacuation channels 114 are symmetrical about the central axis 110. As shown in FIG. 1C, the flow module 106 may include three pairs of radial walls 164 disposed at 120 degrees apart from one another forming three evacuation channels 114 symmetrical to the central axis 110. The symmetrical arrangement of the evacuation channels 114 promotes symmetrical removal of gases from the process region 112, resulting in symmetrical flow of gases across the substrate 116. In addition, the symmetrical positioning of the evacuation channels 114 and radial walls 164 promotes symmetry in the thermal distribution and electrical conductance in the plasma process chamber 100.

The exhaust module 108 includes a symmetric flow valve 180 and a vacuum pump 182 attached to the symmetric flow valve 180. The symmetric flow valve 180 connects to the evacuation channels 114 to provide symmetric and uniform flow in the plasma process chamber 100.

The substrate support assembly 118 is positioned along the central axis 110 to position the substrate 116 symmetrically about the central axis 110. The substrate support assembly 118 is supported by the chassis 154. The substrate support assembly 118 includes a support plate 174, a base plate 176 that are disposed in the process region 112, and a hollow shaft 178 disposed through the central opening 158 of the chassis 154. A bellows 184 may connect between the base plate 176 and the chassis 154 and surround the hollow shaft 178. The bellows 184 allows the substrate support assembly 118 to move vertically along the central axis 110 and provides vacuum seal between the atmosphere volume 168 in the flow module 106 and the process region 112 in the process module 104.

The support plate 174 may be an electrostatic chuck having a chucking electrode 186. The support plate 174 may also include a heating element 188 for heating the substrate 116 during processing. The base plate 176 may include cooling channels 190 formed therein. The chucking electrode 186 may be connected to a bias power source 187 through the hollow shaft 178, the atmosphere volume 168 and one of the through holes 170. The heating element 188 may be connected to a heating power source 189 through the hollow shaft 178, the atmosphere volume 168 and one of the through holes 170. The cooling channels 190 may be connected to a cooling fluid source 191 through the hollow shaft 178, the atmosphere volume 168 and one of the through holes 170.

In one embodiment, an actuator assembly 192 may be coupled to the hollow shaft 178 to move the substrate support assembly 118 vertically. The actuator assembly 192 may be disposed in the atmosphere volume 168. Lift pin actuators 194 may be disposed in the atmosphere volume 168 to move lift pins 196.

A plasma screen 198 may be disposed between the process region 112 and the evacuation channels 114 to confine the plasma within the process region 112. A substrate support liner 199 may be disposed around the substrate support assembly 118 to shield the substrate support assembly 118 from the process chemistry.

During operation, one or more processing gases from the gas source 132 may enter the process region 112 through the showerhead plate 128. A RF power may be applied between the upper electrode 120 and the substrate support assembly 118 to ignite and maintain of the one or more processing gases in the process region 112. The substrate 116 disposed on the substrate support assembly 118 is processed by the plasma. The one or more processing gases may be continuously supplied to the process region 112 and the vacuum pump 182 operates through the symmetric flow valve 180 and the flow module 106 to generate a symmetric and uniform gas flow over the substrate 116.

By defining the process region 112 and the evacuation channels 114 in separate modules, embodiments of the present disclosure provide uniform and symmetric process environment with simplified chamber structure, thus, reducing fabrication costs.

Figure 2A:
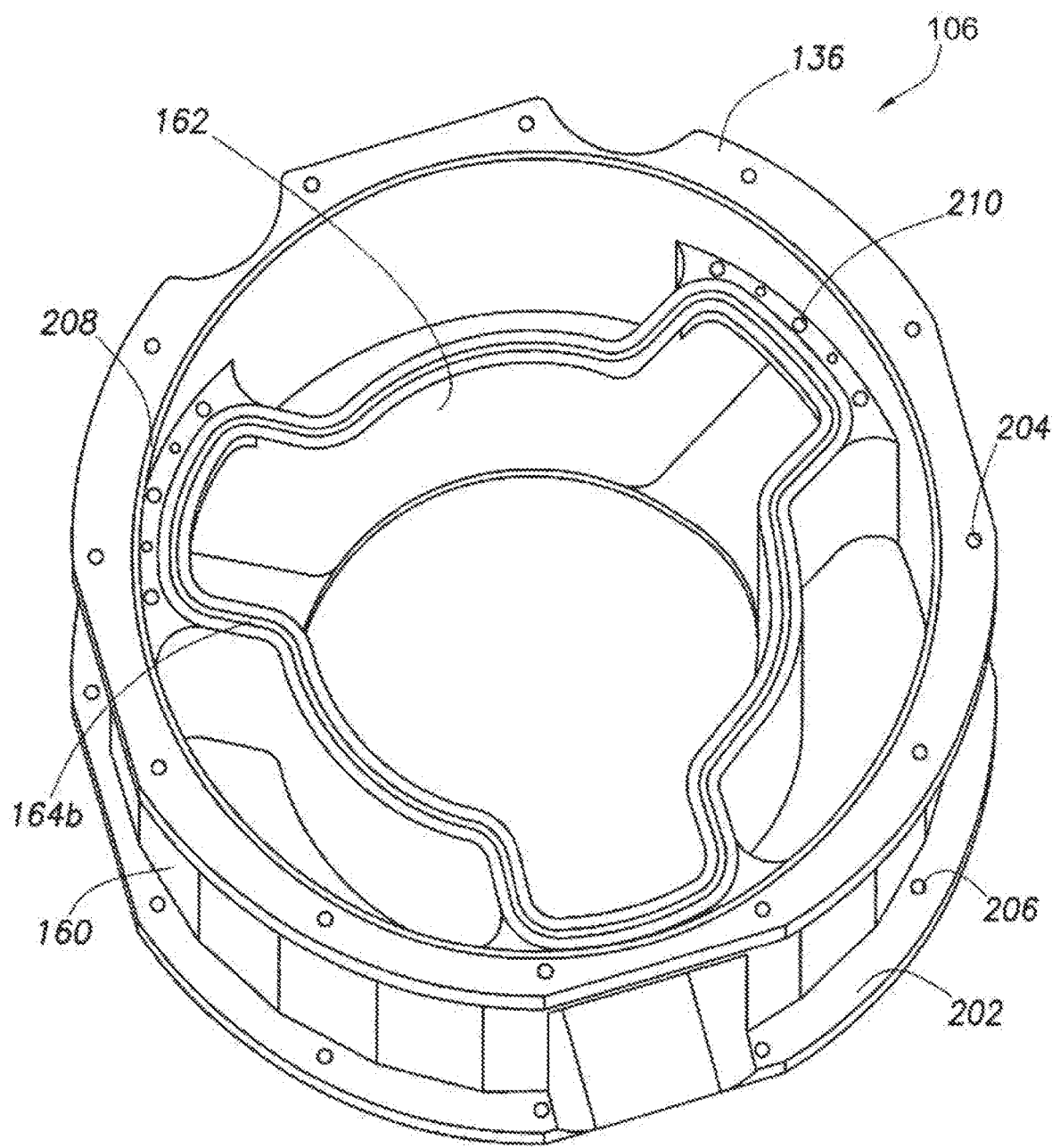
FIG. 2A is a schematic perspective top view of a flow module according to one embodiment of the present disclosure.
Figure 2B:
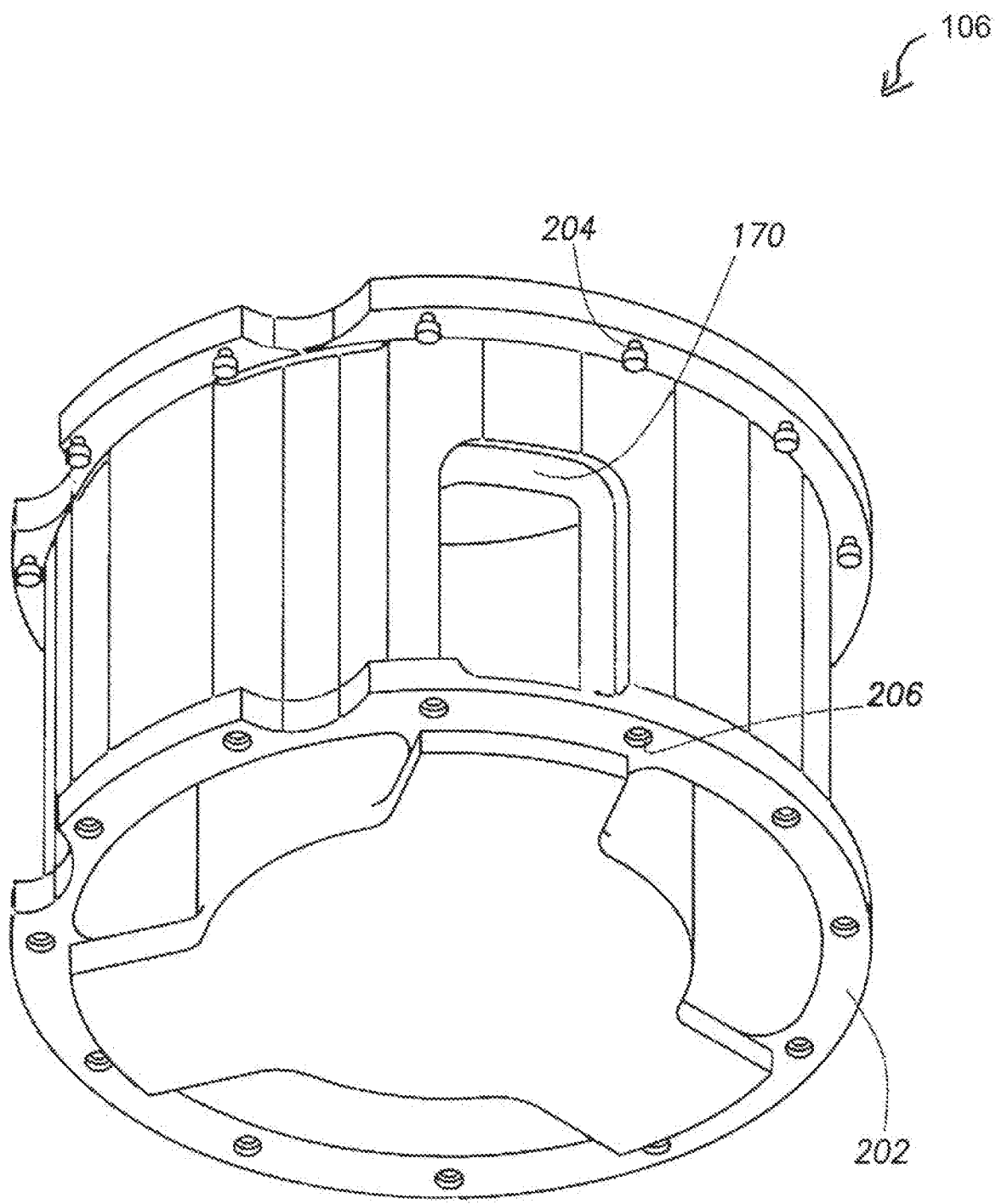
FIG. 2B is a schematic perspective bottom view of the flow module of FIG. 2A.

FIG. 2A is a schematic perspective top view of the flow module 106 according to one embodiment of the present disclosure. FIG. 2B is a schematic perspective bottom view of the flow module 106. The outer wall 160 may include the flange 136 at an upper end to connect with the process module 104 and a flange 202 at a lower end to connect with the exhaust module 108. Alignment holes 204, 206 may be evenly distributed along the flange 136 and the flange 202 for aligning with a process module and an exhaust module respectively. A groove 208 may be formed on the flange 136 to receive a seal. One or more alignment holes 210 may be formed on the upper surface 164a for aligning with a chassis, such as the chassis 154.

Figure 3:
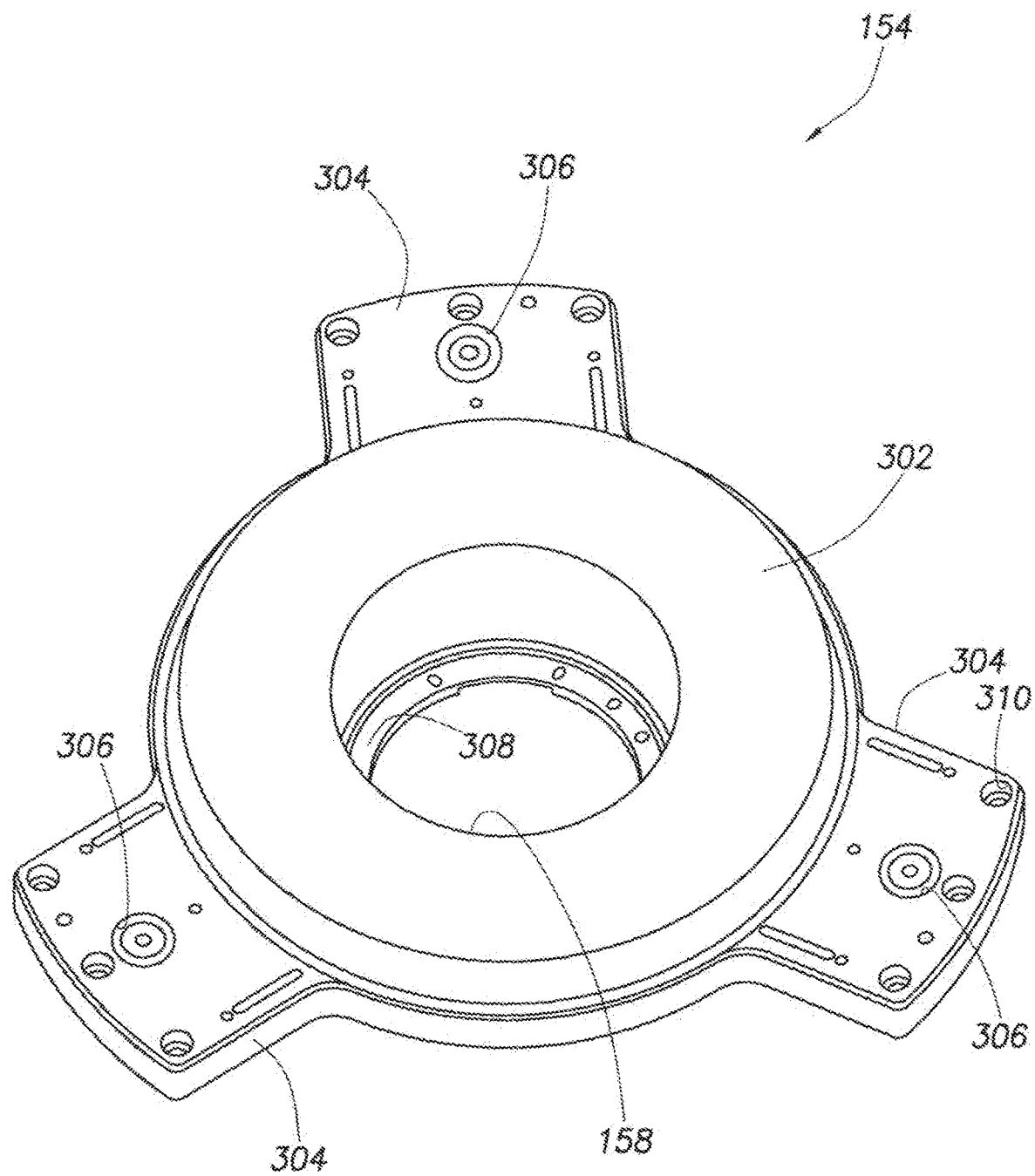
FIG. 3 is a schematic perspective view of a chassis according to one embodiment of the present disclosure.

FIG. 3 is a schematic perspective view of the chassis 154 according to one embodiment of the present disclosure. The chassis 154 provides an interface between a flow module, such as the flow module 106, and a substrate support assembly, such as the substrate assembly 118. The chassis 154 may include a disk shaped body 302 having wings 304 extending outward. The chassis 154 may be coupled to a flow module, such as the flow module 106, to divide the flow module into flow channels for evacuation and an atmosphere volume connected to the exterior environment. The disk shaped body 302 includes the central opening 158 for receiving a substrate support assembly, such as the substrate support assembly 118. A step 308 may be formed at a lower end of the central opening 158. A bellows may be secured to the step 308 achieve vacuum seal around the central opening 158. The disk shaped body 302 may have an outer diameter corresponds to an outer diameter of the inner wall 162 of the flow module 106. The wings 304 correspond to the pairs of radial walls 164. In one embodiment, three wings 304 may be positioned at 120 degrees apart. A lift pin hole 306 may be formed through each wing 304 to receive a substrate lift pin therein. Alignment holes 310 may be formed through each wing 304 to align with the alignment holes 210 of the flow module 106.

In addition to improving process symmetry and uniformity, embodiments of the present disclosure also provide flexibility. For example, by changing one or more of the modules, the plasma process chamber may be configured to perform various processes or to process substrates of various sizes.

FIGS. 4A-4C are schematic sectional views of chamber assemblies assembled from various modules according to embodiments of the present disclosure. The chamber assemblies may be form various process chambers combined with various plasma modules and exhaust modules.

In FIG. 4A, a chamber assembly 400 includes a process module 402 and a flow module 404. The process module 402 may be similar to the process module 104 described above. The flow module 404 may be similar to the flow module 106 described above. The process module 402 may include a substrate support assembly 403 designed to support a substrate having a diameter 408. The flow module 404 may have a height 406 that satisfies the range of vertical movement of the substrate or degrees of variation of the process volume in the process module 402 according to the process requirement.

In FIG. 4B, a chamber assembly 410 is assembled form the process module 402 and a flow module 412. The flow module 412 has a height 414 that is shorter than the height 406 of the flow module 404 of the chamber assembly 400. The flow module 412 with the shorter height may be used when the process requires a shorter height of substrate vertical motion or the substrate does not move vertically. The flow module 412 with a shorter height occupies less space, thus providing a technical advantage. The flow module 412 without substrate vertical movements can significantly reduce system complicity, thus reducing manufacturing and maintenance costs.

In FIG. 4C, a chamber assembly 420 is assembled form a process module 422 and the flow module 412. The process module 422 includes a substrate support assembly 426 designed to support a substrate having a diameter 424. The diameter 424 is larger than the diameter 408 of the process module 402. By selecting a process module designed for a larger substrate, the chamber assembly 420 may be used to process larger substrates without having to increase the diameter of other modules. This allows a relatively smaller under volume to be used for larger substrates, thereby, reducing not only the chamber costs, but also reducing pump size requirement and reducing pumping times which allows for greater substrate throughput.

Even though, embodiments of the present disclosure are described in association with a capacitively coupled plasma chamber, embodiments of the present disclosure may be used to improve symmetry and reduce skew in any processing chambers.

While the foregoing is directed to embodiments of the present disclosure, other and further embodiments of the disclosure may be devised without departing from the, basic scope thereof, and the scope thereof is determined by the claims that follow.

The invention claimed is:

1. A flow module for providing symmetric flow path in a process chamber, the flow module comprising:
  an outer wall shaped to connect with a chamber body of the process chamber, wherein an outer wall includes an upper flange and a lower flange, the flow module is attached to the chamber body at the upper flange;
  an inner wall;
  two or more pairs of radial walls connecting the outer wall and the inner wall, wherein two or more evacuation channels are defined between the inner wall and the outer wall by the two or more pairs of radial walls; and
  a bottom wall coupled to the inner wall and the two or more pairs of radial walls, wherein an atmosphere volume is defined by the inner wall, the bottom wall, and the two or more pairs of radial walls.

2. The flow module of claim 1, wherein the outer wall includes two or more through holes, each through hole positioned between a pair of radial walls.

3. The flow module of claim 1, wherein the outer wall and the inner wall are concentric about a central axis.

4. The flow module of claim 3, wherein the outer wall and the inner wall are substantially cylindrical.

5. The flow module of claim 1, wherein the two or more pairs of radial walls are evenly distributed between the inner wall and the outer wall, and the two or more evacuation channels are symmetric about the central axis.

6. The flow module of claim 1, further comprising:
  a chassis disposed over the inner wall and the two or more pairs of radial walls, the chassis including a central opening configured to receive a shaft of a substrate support assembly.

7. The flow module of claim 6, wherein the chassis comprises a disk shaped body having outwardly extending wings.

8. A flow module for providing symmetric flow path in a process chamber, the flow module comprising:
  an outer wall shaped to connect with a chamber body of the process chamber, wherein an outer wall includes an upper flange and a lower flange, the flow module is attached to the chamber body at the upper flange, wherein the outer wall includes two or more through holes, each through hole positioned between a pair of radial walls;
  an inner wall;
  two or more pairs of radial walls connecting the outer wall and the inner wall, wherein two or more evacuation channels are defined between the inner wall and the outer wall by the two or more pairs of radial walls; and a bottom wall coupled to the inner wall and the two or more pairs of radial walls, wherein an atmosphere volume is defined by the inner wall, the bottom wall, and the two or more pairs of radial walls.

9. The flow module of claim 8, wherein the outer wall and the inner wall are concentric about a central axis.

10. The flow module of claim 9, wherein the outer wall and the inner wall are substantially cylindrical.

11. The flow module of claim 9, wherein the two or more pairs of radial walls are evenly distributed between the inner wall and the outer wall, and the two or more evacuation channels are symmetric about the central axis.

12. The flow module of claim 8, further comprising:

a chassis disposed over the inner wall and the two or more pairs of radial walls, the chassis including a central opening configured to receive a shaft of a substrate support assembly.

13. The flow module of claim 12, wherein the chassis comprises a disk shaped body having outwardly extending wings.

14. A flow module for providing symmetric flow path in a process chamber, the flow module comprising:

an outer wall shaped to connect with a chamber body of the process chamber, wherein an outer wall includes an upper flange and a lower flange, the flow module is attached to the chamber body at the upper flange;

an inner wall;

two or more pairs of radial walls connecting the outer wall and the inner wall, wherein two or more evacuation channels are defined between the inner wall and the outer wall by the two or more pairs of radial walls;

a bottom wall coupled to the inner wall and the two or more pairs of radial walls; and a chassis disposed over the inner wall and the two or more pairs of radial walls, the chassis including a central opening configured to receive a shaft of a substrate support assembly.

15. The flow module of claim 14, wherein the outer wall includes two or more through holes, each through hole positioned between a pair of radial walls.

16. The flow module of claim 14, wherein the outer wall and the inner wall are concentric about a central axis.

17. The flow module of claim 16, wherein the outer wall and the inner wall are substantially cylindrical.

18. The flow module of claim 17, wherein the two or more pairs of radial walls are evenly distributed between the inner wall and the outer wall, and the two or more evacuation channels are symmetric about the central axis.

19. The flow module of claim 14, wherein an atmosphere volume is defined by the inner wall, the bottom wall, and the two or more pairs of radial walls.

20. The flow module of claim 14, wherein the chassis comprises a disk shaped body having outwardly extending wings.

* * * * *